(12) United States Patent
Morf et al.

(10) Patent No.: US 7,816,747 B2
(45) Date of Patent: Oct. 19, 2010

(54) DETECTOR FOR DETECTING ELECTROMAGNETIC WAVES

(75) Inventors: Thomas E. Morf, Gross (CH); Martin Leo Schmatz, Rueschlikon (CH); Jonas R. Weiss, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 11/774,087

(22) Filed: Jul. 6, 2007

(65) Prior Publication Data

US 2008/0251870 A1 Oct. 16, 2008

(30) Foreign Application Priority Data

Jul. 6, 2006  (EP) ................... 06116745

(51) Int. Cl.
 *H01L 27/14* (2006.01)
 *H01L 31/00* (2006.01)
(52) U.S. Cl. .............. 257/428; 257/467; 257/470; 257/E31.001

(58) Field of Classification Search ......... 257/421–425, 257/427, 428, 467, 470, E31.001
See application file for complete search history.

(56) References Cited

U.S. PATENT DOCUMENTS 7,030,453 B1 * 4/2006 Agnese ................. 257/428

* cited by examiner

*Primary Examiner*—Thien F Tran
(74) *Attorney, Agent, or Firm*—David A. Cain (57) ABSTRACT

A detector for detecting electromagnetic waves, the detector having an antenna for receiving the electromagnetic waves, a semiconductor element, wherein a termination section of the semiconductor element establishes a termination resistor of the antenna, wherein the termination section is provided for heating a temperature-sensitive part of the semiconductor element, wherein the semiconductor element comprises a temperature-dependent characteristic that is dependent from the temperature of the temperature sensitive part and a measurement unit for measuring the temperature-dependent characteristic of the semiconductor element.

10 Claims, 7 Drawing Sheets

DETECTOR FOR DETECTING ELECTROMAGNETIC WAVES

CROSS REFERENCES TO RELATED APPLICATIONS

This application is related to EP Patent Application Number 06116745.8, filed Jul. 6, 2006

FIELD OF INVENTION

The present invention is related to a detector for detecting electromagnetic waves and a corresponding thermal imaging device. The present invention is in particular related to detectors for detecting electromagnetic waves in the visible light, infrared and far infrared light range.

BACKGROUND OF THE INVENTION

One known way for detecting optical radiation is by means of optical detectors that convert a photon into an electron via electron/hole generation upon impact of a photon in a generation/recombination zone. The sum of the electrons/holes generated by the photons represents a signal current that corresponds to the received optical power. This is equivalent to the number of photons incident to the detector that are actually converted to electrons. The conversion is typically done in a photo diode.

Thanks to the particle <-> wave duality of light, the light can be interpreted as an electromagnetic wave rather than as a transmitted photon. The frequency of this electromagnetic wave is in the order of hundreds of THz for visible and infrared light emissions and tens of THz for far infrared light. Treating light as electromagnetic wave leads to approaches that use an antenna for reception of this electromagnetic wave. The problem of such an approach is to provide suitable solutions that can convert the extremely high-frequency wave as received by the antenna into a signal which can be handled by electronic devices capable of dealing with such high frequencies.

One way of doing this is by using very advanced diode topologies. Such a diode topology is e.g. known from "INSTITUTE OF PHYSICS PUBLISHING NANOTECHNOLOGY, Nanotechnology 16 (2005), Optical antennas for nano-photonic applications, Javier Alda, José M Rico-Garcé, ýa, José M L opez-Alonso and G Boreman".

Another way of converting the antenna signal to a lower frequency signal is by using a bolometer. One known type of bolometer consists basically of a radiation-sensitive resistance element in one branch of a Wheatstone bridge. The term 'radiation-sensitive' means that the element can absorb incident electromagnetic energy (light waves). Changes of the absorbed electromagnetic energy cause changes in the electrical resistance of the radiation-sensitive-resistance element. The radiation-sensitive resistance element may be e.g. a platinum strip, a semiconductor film, or any other substance whose resistance is altered by slight changes in the amount of radiant energy falling on it.

It is an object of the invention to provide improved solutions for the detection of electromagnetic waves. It is a further object of the invention to provide improved solutions for detecting thermal radiation.

SUMMARY OF THE INVENTION

The present invention is directed to a detector for detecting electromagnetic waves and to a thermal imaging device.

Further embodiments of the invention are provided.

According to a first aspect of the present invention, there is presented a detector for detecting electromagnetic waves, the detector having an antenna for receiving the electromagnetic waves, a semiconductor element, wherein a termination section of the semiconductor element establishes a termination resistor of the antenna, wherein the termination section is provided for heating a temperature-sensitive part of the semiconductor element, wherein the semiconductor element comprises a temperature-dependent characteristic that is dependent from the temperature of the temperature sensitive part and a measurement unit for measuring the temperature-dependent characteristic of the semiconductor element.

The detector according to this aspect of the invention receives the electromagnetic waves by means of the antenna and converts the received electromagnetic radiation into heat by means of the termination section of the semiconductor element. The termination section functions as termination resistor of the antenna. The heat produced in the termination section is used for heating a temperature-sensitive part of the termination section. The temperature-sensitive part can be any part of the semiconductor-element that comprises a measurable temperature-dependent characteristic. Advantageously, the termination section is arranged in the proximity of the temperature-sensitive part. Advantageously, the termination section heats the temperature-sensitive part selectively. In other words, the termination section does not heat the complete semiconductor element evenly or uniformly, but produces the heat at or in the proximity of the temperature sensitive part. In other words, the produced heat is focused on the area of the temperature sensitive part. Such a focusing of the heat on the temperature-sensitive part enhances the sensitivity of the detector.

According to a further embodiment of this aspect of the invention, the semiconductor element is a transistor, wherein the termination section is established by means of an electrode of the transistor and wherein the respective electrode is coupled at two termination points to an arm of the antenna.

According to this embodiment, one of the electrodes of the transistor acts as termination resistor for the antenna. The respective electrode is coupled at two termination points to an arm of the antenna. The respective electrode comprises preferably a gap between the two termination points. In other words, the respective electrode comprises two parts, wherein each part is connected to one of the arms of the antenna. The termination section or termination resistor respectively can be established by using the semiconductor path between the two termination points or the two electrode parts, respectively. The termination points are advantageously arranged at opposite sides of the transistor. This provides space for establishing the required matching impedance between the termination points via the semiconductor substrate. The transistor electrodes offer inexpensive contact possibilities for the antenna.

According to a further embodiment of this aspect of the invention, the semiconductor element is a Field-Effect Transistor (FET), wherein the termination section is established by means of the gate of the FET and wherein the measurement unit is provided for measuring the drain-source leakage current or the gate leakage current of the FET as temperature dependent characteristic.

Field Effect Transistors are widely used for digital circuits and there are several technologies for mass manufacturing available. This allows for inexpensive manufacturing of the detector.

In this embodiment, the gate resistance acts as a termination resistor for the antenna. The Field-Effect Transistor is operated in the sub-threshold area. The electromagnetic radiation received by the antenna is converted to heat right at the gate of the FET. This in turn heats up the drain-source channel of the FET which functions as a temperature-sensitive part of the detector. This in turn affects and influences the sub-threshold gate leakage current as well as the sub-threshold drain-source leakage current which are used as the measurable temperature-dependent characteristic of the semiconductor-element. Both leakage currents can be used as the temperature-dependent characteristic. Using the drain-source leakage current has the advantage that the measurable current is higher and that the leakage signal is easier to measure than the gate leakage signal. Using the gate leakage signal has the advantage that the noise is lower.

According to a further embodiment of this aspect of the invention, the semiconductor element is a bipolar transistor, wherein the termination section is established by means of the base of the bipolar transistor and wherein the measurement unit is provided for measuring the base leakage current or the emitter-collector leakage current of the bipolar transistor as temperature dependent characteristic.

In this embodiment, the base-resistance acts as a termination resistor for the antenna. This can be implemented by applying as termination points two base contacts and by using the semiconductor path between the two base contacts as termination resistor. The bipolar transistor is operated in the sub-threshold area, i.e. in a reverse-biasing mode. The electromagnetic radiation received by the antenna is converted to heat right at the base of the bipolar transistor. This is in turn heating up the collector and the emitter of the bipolar transistor. This in turn affects and influences the sub-threshold base leakage current as well as the sub-threshold collector-emitter leakage current, which can be used as the measurable temperature-dependent characteristic of the semiconductor-element. Using the emitter-collector leakage current has the advantage that the measurable current is higher and that the leakage signal is easier to measure than the base leakage signal. Using the base leakage signal has the advantage that the noise is lower.

According to a further embodiment of this aspect of the invention, the semiconductor element is a bipolar transistor, wherein the detector is provided for applying a substantially constant base-emitter voltage to the bipolar transistor, wherein the termination section is established by means of the base or the emitter of the bipolar transistor and wherein the measurement unit is provided for measuring the collector current as the temperature dependent characteristic.

In this embodiment, the bipolar transistor is operated in a forward-biased mode by means of the substantially constant base-emitter voltage. The base or the emitter acts as termination resistor for the antenna. This can be implemented by applying as termination points two base contacts or two emitter contacts respectively and by using the semiconductor path between the two base contacts or the two emitter contacts as termination resistor. The electromagnetic radiation received by the antenna is converted to heat right at the base or the emitter of the bipolar transistor. This is in turn heating up the collector and the emitter of the bipolar transistor. This in turn affects and influences the collector current which is used as the measurable temperature-dependent characteristic of the semiconductor-element.

According to a further embodiment of this aspect of the invention, the semiconductor element is a diode, wherein the termination section is established by means of one of the electrodes of the diode, wherein the respective electrode is coupled at two termination points to an arm of the antenna and wherein the measurement unit is provided for measuring the reverse current or the forward current of the diode as the temperature-dependent characteristic.

The electrode that provides the termination section comprises preferably a gap between the two termination points. In other words, the respective electrode comprises two parts, wherein each part is connected to one of the arms of the antenna. The termination section or termination resistor respectively is established by using the semiconductor path between the two termination points or the two electrode parts respectively.

The termination points are advantageously arranged at opposite sides of the diode. This provides space for establishing the required matching impedance between the termination points via the semiconductor substrate. The diode may be operated in a forward-biased mode or in a reverse biased mode. The electromagnetic radiation received by the antenna is converted to heat right at the electrode that acts as termination resistor of the antenna. This is in turn heating up the depletion layer of the diode. This in turn affects and influences the reverse current or the forward current respectively.

According to a further embodiment of this aspect of the invention, the FET is a Metal Oxide Semiconductor (MOS)-FET or an Insulated Gate (IG)-FET. Both terms are almost synonymous. However, the term IG-FET includes also insulating gates that do not comprise an oxide. The FET can also be a Metal Epi Semiconductor (MES)-FET including a High-Electron-Mobility-Transistor (HEMT) in which the gate insulation is achieved by means of a depletion zone.

According to a further embodiment of this aspect of the invention, the FET is arranged on an insulating material in Silicon On Insulator (SOI) technology.

This provides for a thermal isolation of the detector and improves the sensitivity of the detector.

According to a further embodiment of this aspect of the invention, the bipolar transistor is arranged on a thermally insulating material.

This provides for a thermal isolation of the detector and improves the sensitivity of the detector.

According to a further embodiment of this aspect of the invention, the antenna is a planar antenna, in particular a planar antenna with a ground plane.

Such planar antennas allows for integration of the antenna and the semiconductor element in one chip. The ground plane improves the shielding of the detector.

According to a further embodiment of the invention, there is provided a detector arrangement comprising one or more detectors as described above and further comprising a reference detector for generating a reference signal representing the temperature dependent characteristic of the semiconductor element without the influence of the received electromagnetic waves.

The reference detector is a dummy detector which is equal or very similar compared to the one or more active detectors. The reference detector gives a reference for changes of the temperature-dependent characteristic due to other influences than electromagnetic waves received by the antenna. This can e.g. be implemented by not connecting an antenna at all to the semiconductor element or by shielding the antenna from the incident electromagnetic waves. Such other influences are e.g. a change of the ambient temperature.

According to a preferred embodiment of the invention, there is provided a reference detector for each active detector of the detector arrangement. This has the advantage that changes of the temperature-dependent characteristic that are caused by variations in the manufacturing process can be compensated.

According to another embodiment of the invention, other influences than electromagnetic waves received by the antenna can be compensated by white balance or alignment approaches.

According to another embodiment of the invention, there is provided a temperature measurement unit for measuring the temperature of the detector arrangement. Having knowledge about the temperature of the detector arrangement allows for deriving insights about the actual current derivatives of the detector arrangement.

According to a second aspect of the invention, there is provided a thermal imaging device comprising of one or more detectors, a processing unit for processing detector signals received from the detectors and a display for displaying thermal images by means of the processed detector signals.

Such a thermal imaging device can be used for night vision applications, medical imaging applications, flow sensors and several other applications.

According to an embodiment of this aspect of the invention, the thermal imaging device comprises a lens for focusing the electromagnetic waves on the detector. This enhances the sensitivity of the sensor.

DESCRIPTION OF THE DRAWINGS

Preferred embodiments of the invention are described in detail below, by way of example only, with reference to the following schematic drawings.

The drawings are provided for illustrative purpose only and do not necessarily represent practical examples of the present invention to scale.

DESCRIPTION OF PREFERRED EMBODIMENTS

Figure 1:
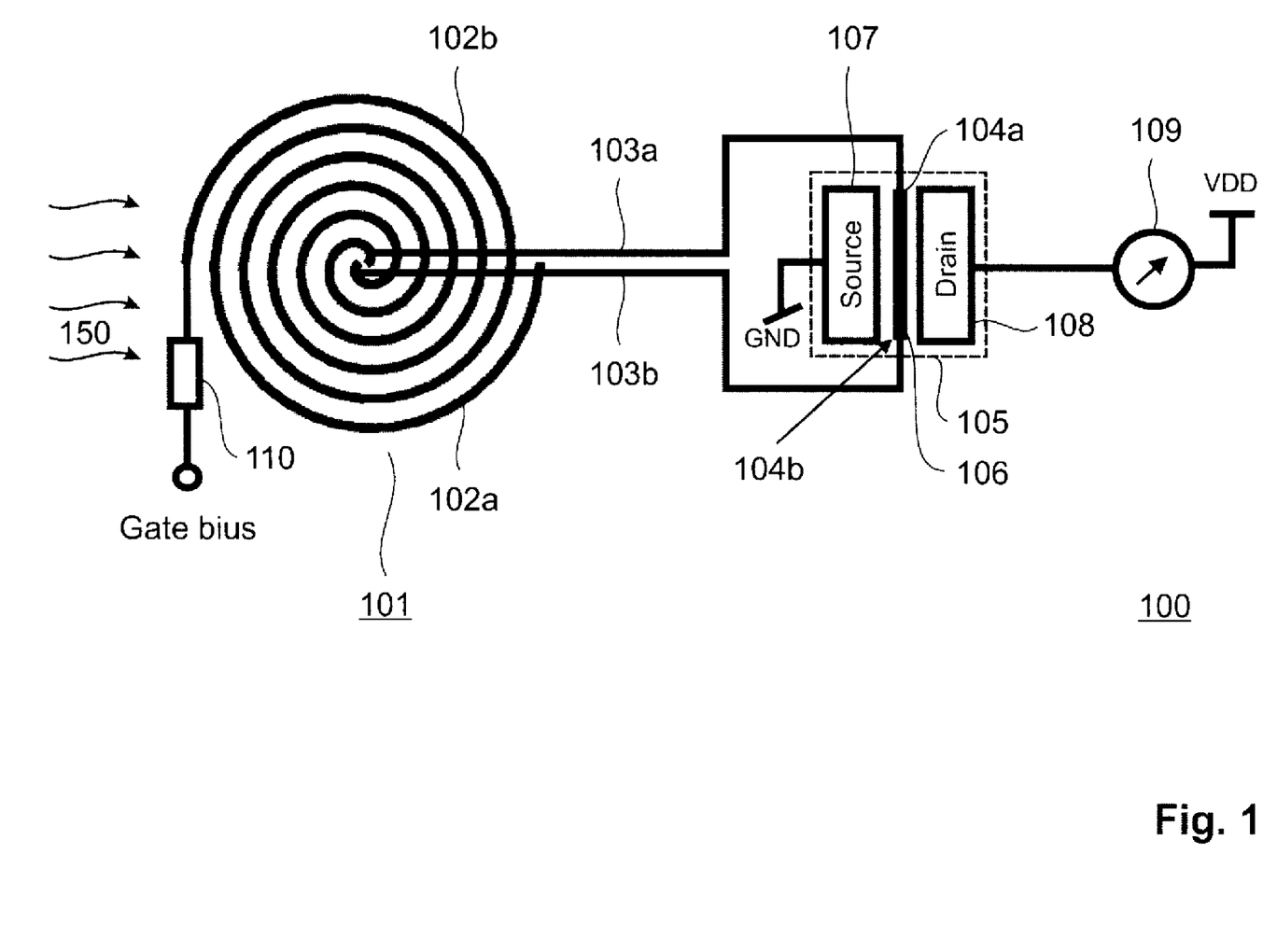
FIG. 1 shows a schematic illustration of a detector for detecting electromagnetic waves according to an embodiment of the present invention.

FIG. 1 shows a schematic illustration of a detector 100 for detecting electromagnetic waves 150 according to an embodiment of the present invention. The detector 100 is in particular suitable for detecting electromagnetic waves 150 with a frequency in the THz range. The detector 100 comprises an antenna 101 for receiving the electromagnetic waves 150. The antenna 101 can be e.g. a planar broadband antenna with a ground plane. The antenna 101 is in particular suited to receive electromagnetic waves in a wavelength range between 3 μm and 15 μm. The antenna 101 comprises a first arm 102a and a second arm 102b. The first arm 102a is connected by means of a first via 103a to a first termination point 104a and the second arm 102b is connected by means of a second via 103b to a second termination point 104b. The first termination point 104a and the second termination point 104b are contact points for contacting a gate 106 of a Field Effect Transistor (FET) 105. Thus the gate 106 of the FET 105 is connected on both sides of the FET 105 to the antenna 101. The FET 105 is preferably a Metal Oxide Semiconductor (MOS)-FET or an Insulated Gate (IG)-FET respectively. The gate resistance between the first termination point 104a and the second termination point 104b acts as termination resistor for the antenna 101. The value of the gate resistance is preferably designed in such a way that the antenna 101 is matched by means of the gate resistance. The source 107 of the FET 105 is coupled to ground potential. The drain 108 of the FET 105 is biased with a positive potential VDD. Between the drain 108 of the FET 105 and the positive potential VDD a measurement unit 109 for measuring a temperature-sensitive characteristic of the FET 105 is provided. According to this exemplary embodiment of the invention the measuring unit 109 is a current meter.

The second arm 102b of the antenna 101 is coupled to a gate bias potential via a resistor 110. The resistor 110 could be replaced by an inductor.

The FET 105 is operated in sub-threshold mode, i.e. there are only leakage currents flowing.

In operation, the detector 100 receives electromagnetic waves 150 via the antenna 101. The electromagnetic energy received by the antenna 101 is converted to heat by means of the gate resistance of the gate 106. This is in turn heating up the drain-source channel of the FET 105 which functions as temperature-sensitive part of the detector 100. This in turn affects and influences the sub-threshold gate leakage current as well as the sub-threshold drain-source leakage current of the FET 105 which can be used as the measurable temperature-dependent characteristic of the FET 105. In the embodiment shown in FIG. 1 the temperature dependent drain-source leakage current is measured by means of the measurement unit 109.

Figure 2:
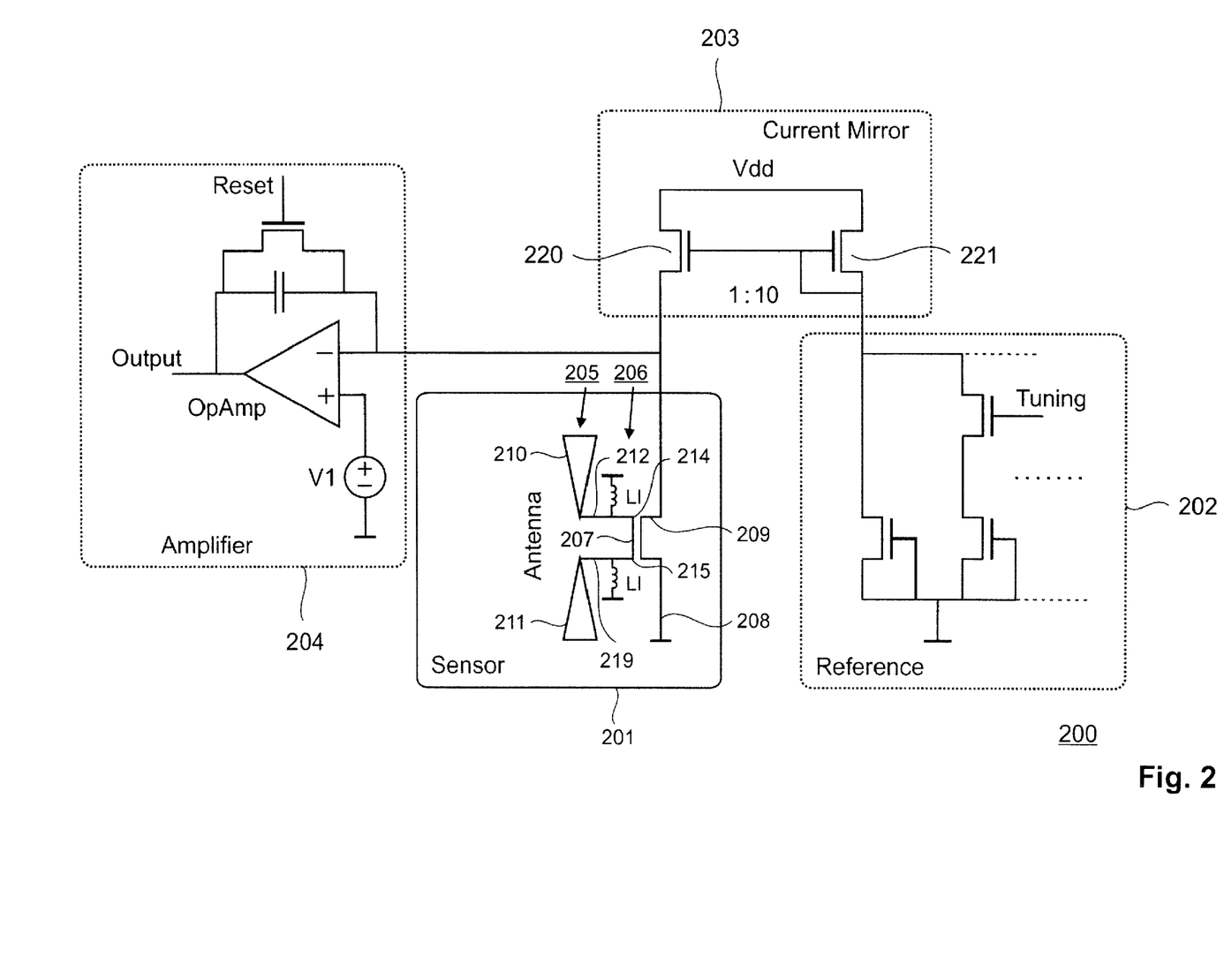
FIG. 2 shows a schematic illustration of a circuit diagram of a detector according to an embodiment of the invention.

FIG. 2 shows a circuit diagram of a readout circuit of a detector 200 according to an embodiment of the invention. The readout circuit comprises a sensor circuit 201, a reference circuit 202, a current mirror circuit 203 and an amplifier circuit 204. The sensor circuit 201 comprises an antenna 205 as well as a Field-Effect-Transistor (FET) 206. The FET 206 comprises a gate 207, a source 208 and a drain 209. The gate 207 and the source 208 are coupled to ground potential. The drain 209 is biased with a positive potential of e.g. 1 V.

The antenna 205 comprises a first arm 210 and a second arm 211 as well as a first via 212 and a second via 213. The FET 206 is a MOS-FET. The gate 207 of the FET 206 is connected at a first termination point 214 to the first via 212 and at a second termination point 215 to the second via 213.

The drain 209 is coupled to the current mirror circuit 203. The current mirror circuit 203 comprises a transistor 220 and a transistor 221. The current mirror circuit 203 mirrors the drain-source current of the FET 206 with e.g. the factor 1:10. The current mirror circuit 203 performs effectively a subtraction of the current in the reference circuit 202 and the current in the sensor circuit 201 to reduce the required dynamic range of the rest of the readout electronic.

The reference circuit 202 comprises several switchable reference transistors to tune the readout circuit. For example, the tuning can be such that the current of the reference circuit 202 is ten times higher than the current in the sensor circuit 201.

The amplifier circuit 204 amplifies the drain-source current of the FET 206.

The FET 206 is operated in sub-threshold mode, i.e. there are only leakage currents flowing.

In operation, the detector 200 receives electromagnetic waves via the antenna 205. The electromagnetic energy received by the antenna 205 is converted to heat by means of the gate resistance of the gate 207. This is in turn heating up the drain-source channel of the FET 206 which functions as temperature-sensitive part of the detector 200. This in turn affects and influences the drain-source leakage current of the FET 206 which is amplified by means of the amplifier circuit 204 and can then be measured by a further not shown measurement unit.

Figure 3:
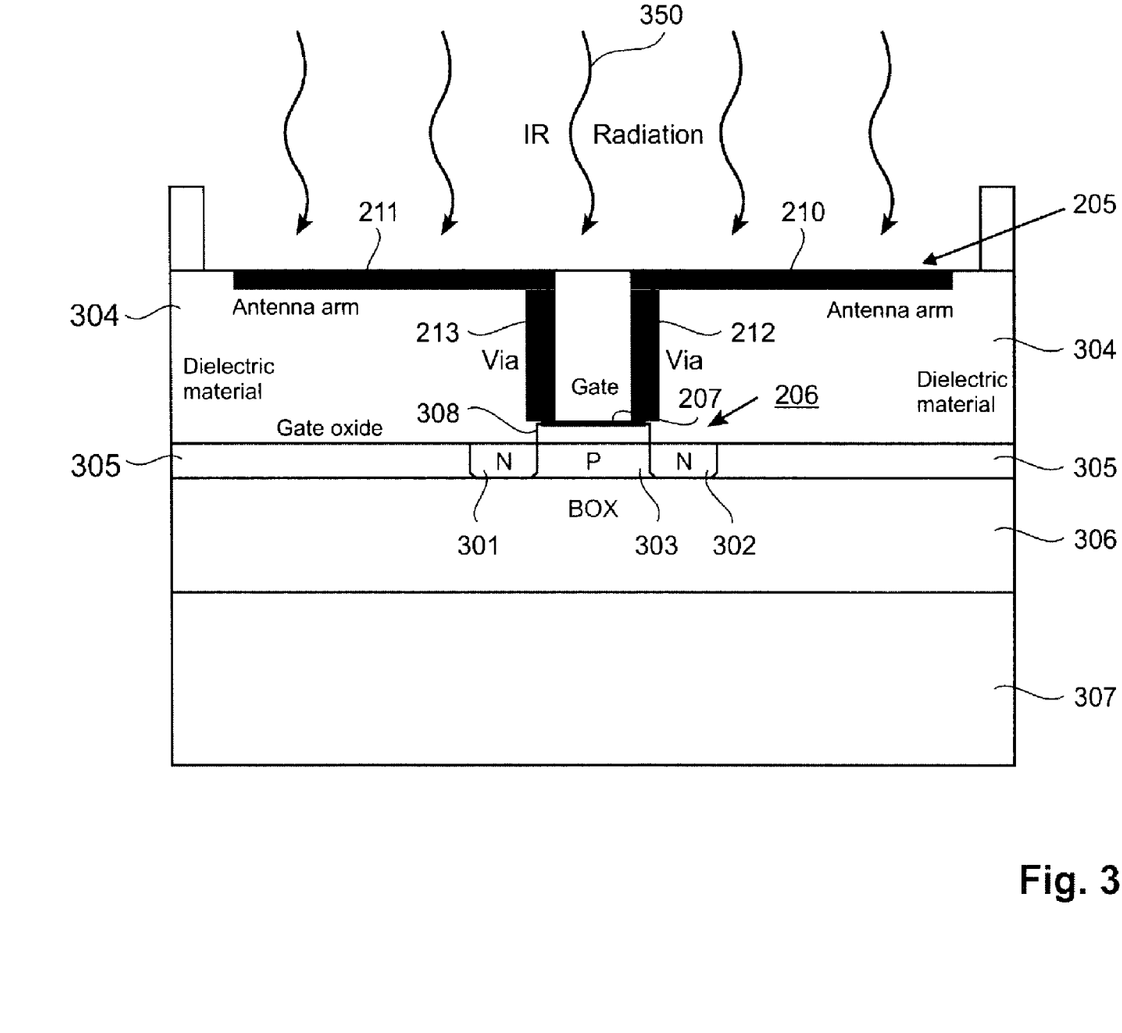
FIG. 3 shows a schematic cross-section of an integrated circuit comprising an antenna and a semiconductor element of a detector according to an embodiment of the present invention.

FIG. 3 shows a schematic cross-section of the sensor circuit 201 as shown in FIG. 2. The sensor circuit 201 is implemented as integrated circuit. It comprises the antenna 205 and the FET 206. The first arm 210 and the second arm 211 of the antenna 205 are arranged in one common plane on the surface of the sensor circuit 201. The first via 212 and the second via 213 extend orthogonal to the first arm 210 and the second arm 211. Below the gate electrode 207 an insulating layer 308 of e.g. gate oxide is arranged. The FET 206 comprises a first n-doped layer 301, a second n-doped layer 302 and in the middle a p-doped layer 303. In other words, the FET 206 is a n-channel MOS-FET. The first n-doped layer 301 is connected to a not shown source-electrode and the second n-doped layer 302 is connected to a not shown drain-electrode. The antenna 205 is a planar antenna that is arranged on a dielectric substrate 304. Next to the first n-doped layer 301 and next to the second n-doped layer 302 are arranged insulating oxide layers 305. The integrated circuit of the sensor circuit 201 further comprises a buried oxide (BOX) layer 306 and a Silicon layer 307.

The antenna 205 is provided for receiving electromagnetic waves 350.

Figure 4:
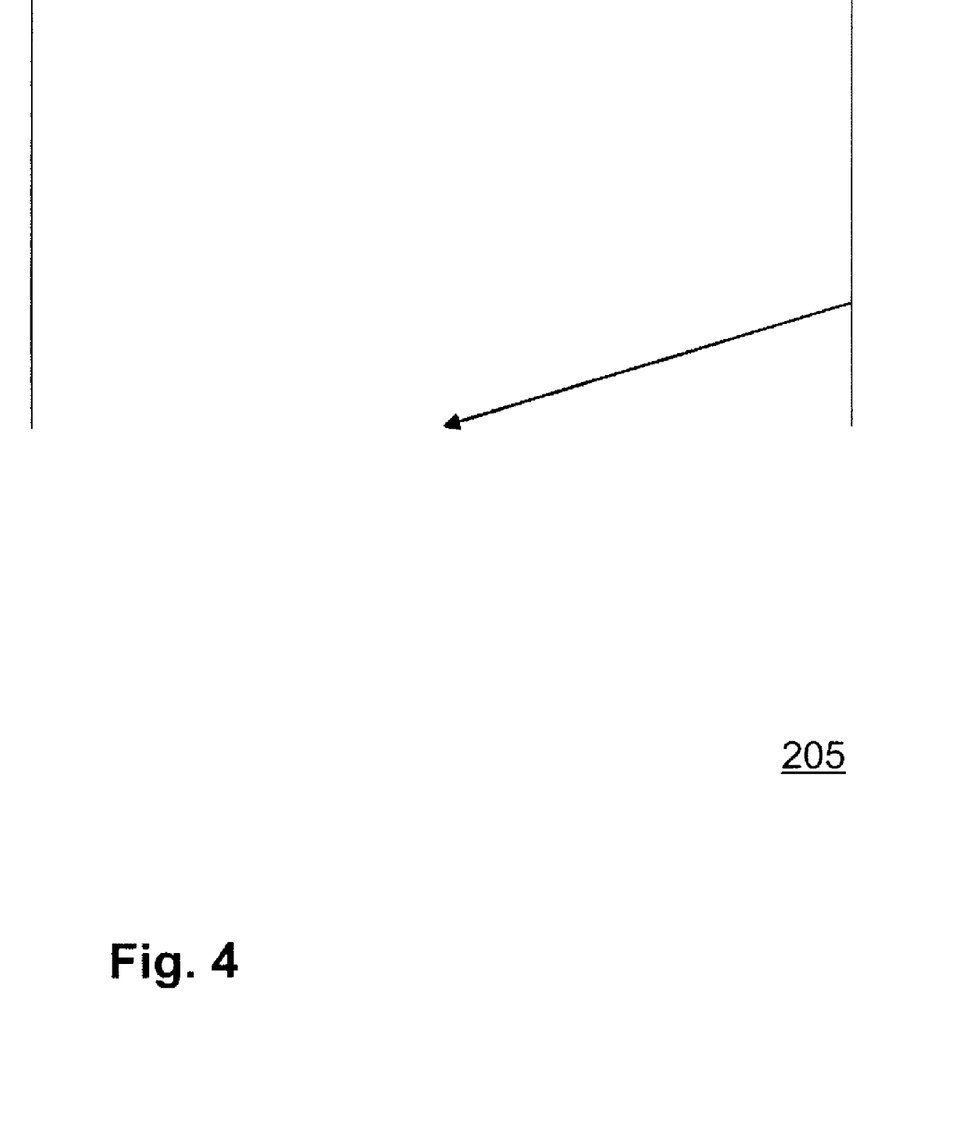
FIG. 4 shows the layout of a planar antenna of a detector according to an exemplary embodiment of the invention.

FIG. 4 shows as exemplary embodiment a top view of the layout of the antenna 205 of FIG. 2 and FIG. 3 in more detail. It is a logarithmically periodic antenna that is designed for a wavelength range of 5 μm to 24 μm.

Figure 5:
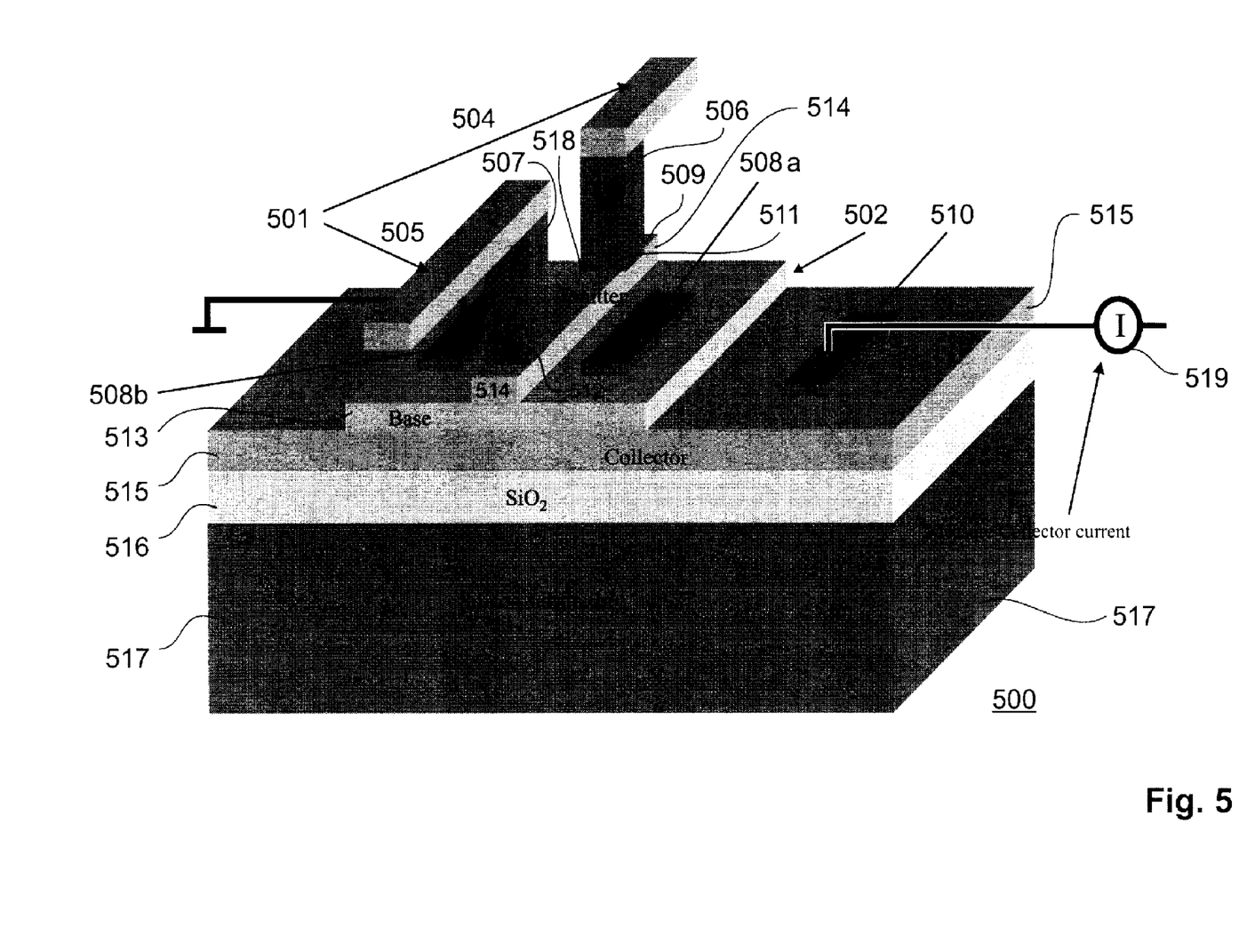
FIG. 5 shows a 3-dimensional view of another detector according to an embodiment of the invention comprising a bipolar transistor.

FIG. 5 shows a 3-dimensional view of a detector 500 according to another embodiment of the present invention. The detector 500 is manufactured in SOI-technology. The detector 500 comprises an antenna 501 and as semiconductor element a transistor 502. The antenna 501 comprises a first arm 504 and a second arm 505 as well as a first via 506 and a second via 507. The transistor 502 is a bipolar transistor and comprises two base electrodes 508a and 508b, an emitter electrode 509 and a collector electrode 510.

The emitter electrode 509 is connected at a first termination point or termination area 511 to the first via 506 and at a second termination point or termination area 512 to the second via 507.

The two base electrodes 508a and 508b are coupled to a base layer 513, the emitter electrode 509 to an emitter layer 514 and the collector electrode 510 to a collector layer 515.

Below the collector layer 515 there is arranged an insulating layer 516 of silicon-dioxide or of another thermally insulating material. Below the insulating layer 516 there is provided a base layer 517 of a semiconductor material, in particular silicon.

The antenna 501 is schematically illustrated as dipole antenna. It can generally be any antenna that is suitable for the required frequency range. It can be e.g. implemented as planar antenna as well, e.g. by means of a planar antenna as shown in FIG. 4. In the case of a planar antenna, the antenna 501 would be embedded in a not shown layer of dielectric material.

In this embodiment, the bipolar transistor 502 of the detector is operated in a forward-biased mode. In operation, a substantially constant base-emitter voltage is applied to the two base electrodes 508a and 508b and the emitter electrode 509. The emitter electrode 509 acts as termination resistor for the antenna 501. The emitter electrode 509 is designed in such a way that the electrical resistance between the first termination point 511 and the second termination point 512 corresponds to the matching impedance of the antenna. The electrical resistance will preferably be established by means of the emitter layer 514. Preferably the emitter electrode 509 comprises a gap 518 between the first termination point 511 and the second termination point 512.

The electromagnetic radiation received by the antenna 501 is converted to heat by means of the electrical resistance between the first termination point 511 and the second termination point 512 of the emitter electrode 509. This is in turn heating up the base layer 513 and the collector layer 515 of the bipolar transistor 502. This in turn affects and influences the collector current which can be measured at the collector electrode 510. The collector current is measured by means of a measuring unit 519. The measuring unit 519 is implemented as current meter.

In this embodiment of the invention, the collector current is used as measurable temperature-dependent characteristic of the bipolar transistor 502.

As a further embodiment, the antenna 501 could be terminated by means of the two base electrodes 508a and 508b. Then, the resistance between the two base electrodes 508a and 508b (the resistance of the base layer 513) would establish the termination resistor for the antenna 501.

According to a further embodiment of the invention the bipolar transistor 502 can be operated in the sub-threshold area, i.e. in a reverse-biasing mode. In this embodiment the sub-threshold base leakage current in the base layer 513 or the sub-threshold collector-emitter leakage current in the emitter layer 514 or the collector layer 515 can be used as the measurable temperature-dependent characteristic of the bipolar-transistor 502.

Figure 6A:
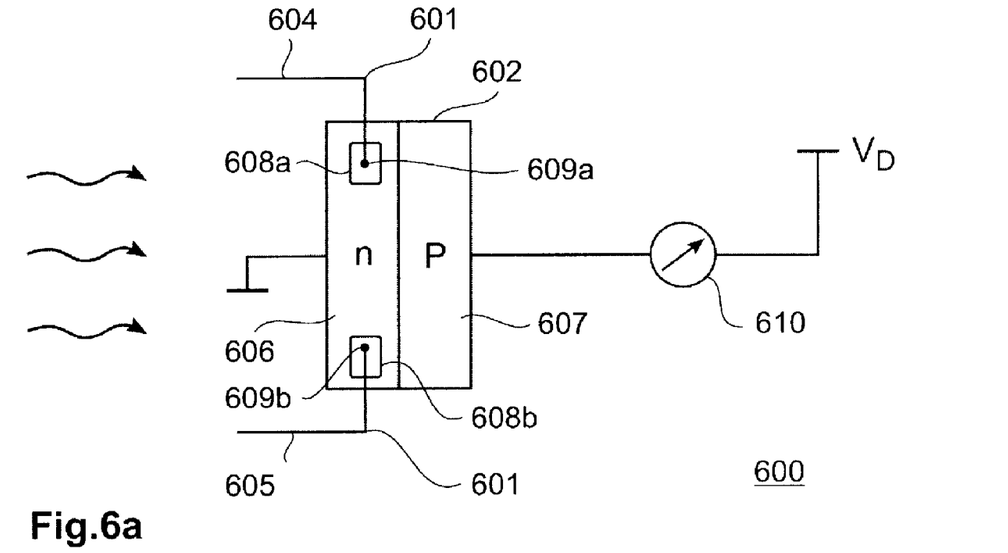
FIG. 6a shows a top view of another detector according to an embodiment of the invention comprising a diode.

FIG. 6a shows a top view of a detector 600 according to a further embodiment of the invention. The detector 600 comprises an antenna 601 and as semiconductor element a diode 602. The antenna 601 comprises a first arm 604 and a second arm 605. The diode 602 comprises a n-doped layer 606 and a p-doped layer 607. The n-doped layer 606 comprises two electrodes or electrode parts 608a and 608b. The first arm 604 of the antenna 601 is connected at a first termination point 609a to the electrode 608a and the second arm 605 at a second termination point 609b to the second electrode 608b.

The diode 602 is operated in a forward-biased mode. This is established by applying a positive voltage $V_D$ to the p-doted layer 607.

The resistance between the electrodes 608a and 608b functions as matching impedance for the antenna 601. The electromagnetic radiation received by the antenna 601 is converted to heat right between these electrodes. This heats up the depletion layer between the n-doped layer 606 and the p-doped layer 607. This in turn affects and influences the forward current of the diode 602 which is measured as the temperature-dependent characteristic by means of a current meter 610.

Figure 6B:
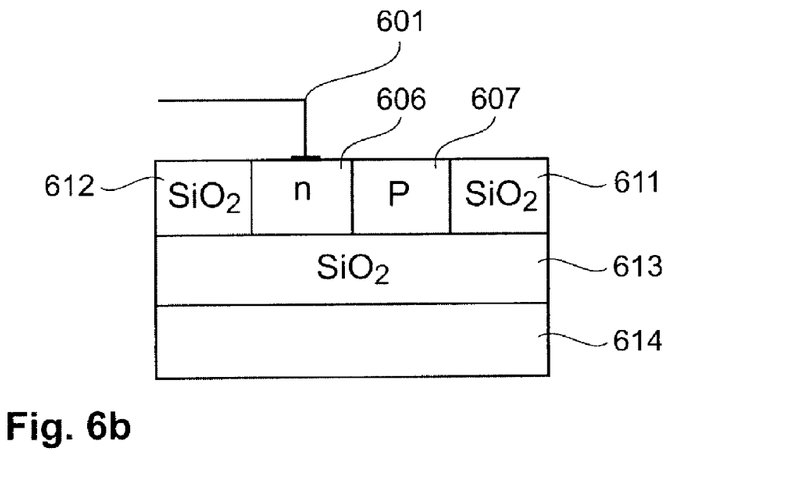
FIG. 6b shows a cross-section of the detector of FIG. 6a, FIG. 7 shows a schematic illustration of a thermal imaging device.

FIG. 6b shows a cross section of the diode 602. Next to the n-doped layer 606 and the p-doped layer 607 there are arranged thermally insulating layers 611 and 612 of silicon-dioxide or of another thermally insulating material. Below the layers 606, 607, 611 and 612 there is provided another thermally insulating layer 613 of silicon-dioxide or of another thermally insulating material. Below the layer 613 there is provided a base layer 614 of a semiconductor material, in particular silicon.

Figure 7:
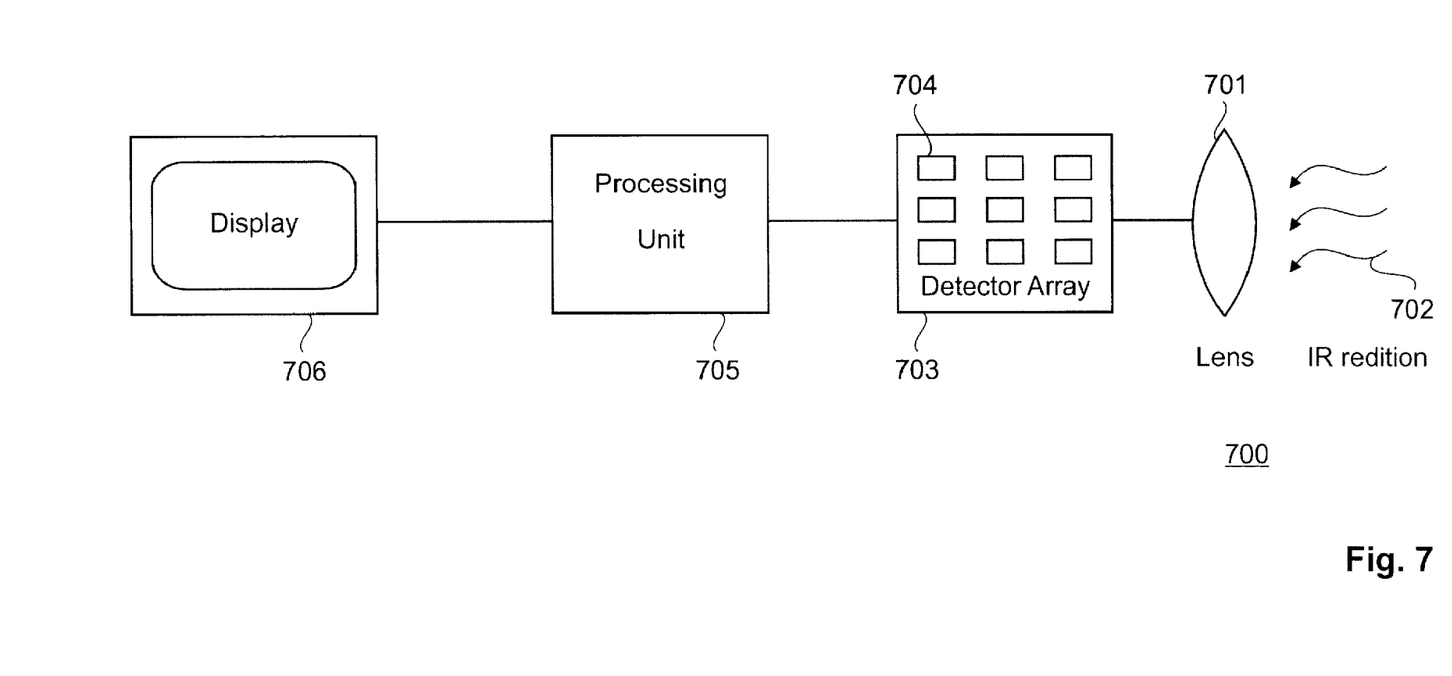

FIG. 7 shows a schematic illustration of a thermal imaging device 700 according to an embodiment of the invention.

The thermal imaging device 700 comprises a lens 701 for focusing the electromagnetic waves 702 on a detector array 703. The detector array 703 comprises several detectors 704 arranged in rows and columns for detecting the electromagnetic waves 702. The lens 701 can be made movable, so that the incident electromagnetic waves (radiation) 702 can be focused on a single row of the detector array 703 or even on a single detector 704. This corresponds to a scanning imaging device.

The thermal imaging device 700 comprises a processing unit 705 for processing detector signals received from the detectors 704.

The processed detector signals are forwarded to a display 706 that is provided for displaying thermal images of the received electromagnetic waves 702.

Any disclosed embodiment may be combined with one or several of the other embodiments shown and/or described. This is also possible for one or more features of the embodiments.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself.

Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

What is claimed is:

1. A detector for detecting electromagnetic waves, comprising:
   an antenna for receiving the electromagnetic waves;
   a semiconductor element, wherein a termination section of the semiconductor element establishes a termination resistor of the antenna, wherein the termination section is provided for heating a temperature-sensitive part of the semiconductor element, wherein the semiconductor element comprises a temperature-dependent characteristic that is dependent from the temperature of the temperature sensitive part; and
   a measurement unit for measuring the temperature-dependent characteristic of the semiconductor element.

2. The detector of claim 1, wherein the semiconductor element is a transistor, wherein the termination section is established by means of an electrode of the transistor and wherein the respective electrode is coupled at two termination points to an arm of the antenna.

3. The detector of claim 2, wherein the semiconductor element is a Field-Effect Transistor (FET), wherein the termination section is established by means of the gate of the FET and wherein the measurement unit is provided for measuring the drain-source leakage current or the gate leakage current of the FET as the temperature-dependent characteristic.

4. The detector of claim 3, wherein the FET is a Metal Oxide Semiconductor (MOS)-FET, an Insulated Gate (IG)-FET or a Metal Epi Semiconductor (MES)-FET.

5. The detector of claim 3, wherein the FET is arranged on an insulating material in Silicon On Insulator (SOI) technology.

6. The detector of claim 2, wherein the semiconductor element is a bipolar transistor, wherein the termination section is established by means of the base of the bipolar transistor and wherein the measurement unit is provided for measuring the base leakage current or the emitter-collector leakage current of the bipolar transistor as the temperature-dependent characteristic.

7. The detector of claim 6, wherein the bipolar transistor is arranged on a thermally insulating material.

8. The detector of claim 2, wherein the semiconductor element is a bipolar transistor, wherein the detector is provided for applying a substantially constant base-emitter voltage to the bipolar transistor, wherein the termination section is established by means of the base or the emitter of the bipolar transistor and wherein the measurement unit is provided for measuring the collector current as the temperature-dependent characteristic.

9. The detector of claim 1, wherein the semiconductor element is a diode, wherein the termination section is established by means of one of the electrodes of the diode, wherein the respective electrode is coupled at two termination points to an arm of the antenna and wherein the measurement unit is provided for measuring the reverse current or the forward current of the diode as the temperature-dependent characteristic.

10. The detector of claim 1, wherein the antenna is a planar antenna.

* * * * *